(12) United States Patent
Hoshikawa et al.

(10) Patent No.: US 10,235,308 B2
(45) Date of Patent: Mar. 19, 2019

(54) WRITE ENABLE CIRCUIT, ACCESS SWITCHING CIRCUIT AND ANALOG-TO-DIGITAL CONVERTER UNIT

(71) Applicant: Mitsubishi Electric Corporation, Tokyo (JP)

(72) Inventors: Masaru Hoshikawa, Tokyo (JP); Masataka Watahiki, Tokyo (JP); Yuta Takenaka, Tokyo (JP)

(73) Assignee: Mistubishi Electric Corporation, Tokyo (JP)

( * ) Notice: Subject to any disclaimer, the term of this patent is extended or adjusted under 35 U.S.C. 154(b) by 0 days.

(21) Appl. No.: 15/532,575

(22) PCT Filed: Dec. 5, 2014

(86) PCT No.: PCT/JP2014/082269
§ 371 (c)(1),
(2) Date: Jun. 2, 2017

(87) PCT Pub. No.: WO2016/088255
PCT Pub. Date: Jun. 9, 2016

(65) Prior Publication Data
US 2017/0344497 A1    Nov. 30, 2017

(51) Int. Cl.
*H03M 1/12* (2006.01)
*G06F 13/12* (2006.01)
(Continued)

(52) U.S. Cl.
CPC ........ *G06F 13/122* (2013.01); *G06F 13/1689* (2013.01); *G06F 13/36* (2013.01); *H03M 1/12* (2013.01); *G05B 2219/35561* (2013.01)

(58) Field of Classification Search
CPC .. G06F 13/122; G06F 13/161; G06F 13/1689; G06F 13/36; G06F 13/38;
(Continued)

(56) References Cited

U.S. PATENT DOCUMENTS

| | | | |
|---|---|---|---|
| 9,869,988 B2 * | 1/2018 | Abe | G05B 19/054 |
| 2002/0154046 A1 * | 10/2002 | Drentea | H03M 3/396 |
| | | | 341/143 |

(Continued)

FOREIGN PATENT DOCUMENTS

| | | |
|---|---|---|
| JP | 07-146756 A | 6/1995 |
| JP | 2006-197023 A | 7/2006 |

(Continued)

OTHER PUBLICATIONS

International Search Report for PCT/JP2014/082269 dated Feb. 10, 2015 [PCT/ISA/210].

(Continued)

*Primary Examiner* — Thomas J Cleary
(74) *Attorney, Agent, or Firm* — Sughrue Mion, PLLC; Richard C. Turner

(57) ABSTRACT

A write-enable circuit outputting a write-enable signal for digital data, in an analog-to-digital converter comprising a bus-controller connected to an external unit, an arithmetic processing unit performing data processing, and an arithmetic unit holding the data and having a normal access mode in which the data are temporarily written into the arithmetic processing unit and then written into the bus-controller and a high-speed access mode in which the data are written directly into the bus-controller. The circuit comprises an address-coincidence-determining circuit provided in the arithmetic unit outputting a write-enable signal from the arithmetic unit when a predetermined address for a memory of the bus-controller coincides with an address specified by the arithmetic processing unit; and a logic circuit inputting the write-enable signal to the bus-controller when the arithmetic processing unit asserts a high-speed access signal indicating that now is in the high-speed access mode.

3 Claims, 3 Drawing Sheets

(51) Int. Cl.
*G06F 13/16* (2006.01)
*G06F 13/36* (2006.01)

(58) Field of Classification Search
CPC ........ G06F 13/40; G06F 13/4022; G06F 3/05; H03M 1/12
See application file for complete search history.

(56) References Cited

U.S. PATENT DOCUMENTS

| | | | |
|---|---|---|---|
| 2005/0030404 A1* | 2/2005 | Takahashi | H04N 5/232 348/333.01 |
| 2006/0155969 A1 | 7/2006 | Yoda et al. | |
| 2011/0060894 A1* | 3/2011 | Graef | G06F 1/3287 712/229 |
| 2012/0221679 A1 | 8/2012 | Yamamoto et al. | |
| 2013/0033390 A1 | 2/2013 | Hoshikawa et al. | |

FOREIGN PATENT DOCUMENTS

| | | |
|---|---|---|
| JP | 4902824 B1 | 3/2012 |
| JP | 2012-181573 A | 9/2012 |
| JP | 2012-181784 A | 9/2012 |
| JP | 5367194 B1 | 12/2013 |
| WO | 2014/064846 A1 | 5/2014 |

OTHER PUBLICATIONS

Written Opinion for PCT/JP2014/082269 dated Feb. 10, 2015 [PCT/ISA/237].

* cited by examiner

US 10,235,308 B2

WRITE ENABLE CIRCUIT, ACCESS SWITCHING CIRCUIT AND ANALOG-TO-DIGITAL CONVERTER UNIT

CROSS REFERENCE TO RELATED APPLICATIONS

This application is a National Stage of International Application No. PCT/JP2014/082269 filed Dec. 5, 2014, the contents of all of which are incorporated herein by reference in their entirety.

FIELD

The present invention relates to a write enable circuit of an analog-to-digital converter unit of a programmable logic controller system, an access switching circuit of the analog-to-digital converter unit, and the analog-to-digital converter unit.

BACKGROUND

The analog-to-digital converter unit in a programmable logic controller system, which is disclosed in Patent Literature 1, comprises an MPU (Micro Processing Unit), an arithmetic unit, a bus control unit and an analog-to-digital converter device. Analog data inputted to the analog-to-digital converter device from outside the analog-to-digital converter unit are converted into digital data. The converted digital data are inputted to the arithmetic unit and arithmetic processing is performed thereon. The digital data subjected to arithmetic processing are transferred to the bus control unit by the MPU and transferred to a CPU (Central Processing Unit) from the bus control unit via a base unit.

The marketplace demands that data conversion and response in the programmable logic controller system be made faster in processing, and to this end, the processing in the analog-to-digital converter unit needs to be made faster. An object to be made faster in the internal processing of the analog-to-digital converter unit is the time required for data conversion by the analog-to-digital converter device, the operation time in the arithmetic unit, or the time required for data transfer by the MPU.

CITATION LIST

Patent Literature

Patent Literature 1: Japanese Patent Application Laid-open Publication No. H07-146756

SUMMARY

Technical Problem

As mentioned above, as one of objects that need to be made faster in the internal processing of the analog-to-digital converter unit, there is the time required for data transfer by the MPU to be shortened.

In the analog-to-digital converter unit having the above-mentioned configuration, data are written into the bus control unit after the MPU reads the data from the arithmetic unit, so that the read operation and write operation need their respective transfer times. This is one of the factors which make it difficult to speed up the internal processing in the analog-to-digital converter unit.

The present invention has been made in view of the above circumstances, and an object thereof is to provide a write enable circuit which can shorten the time required for data transfer from the arithmetic unit to the bus control unit.

Solution to Problem

In order to solve the above-mentioned problems and achieve the object, the present invention provides a write enable circuit that outputs a write enable signal for digital data obtained by analog-to-digital conversion, in an analog-to-digital converter unit comprising a bus control unit connected to an external unit, an arithmetic processing unit to perform data processing, and an arithmetic unit to hold the digital data, and having a normal access mode in which the digital data are temporarily written into the arithmetic processing unit and then written into the bus control unit and a high-speed access mode in which the digital data are written directly into the bus control unit, the write enable circuit comprising: an address coincidence determining circuit provided in the arithmetic unit to output a write enable signal from the arithmetic unit when a predetermined address for a memory of the bus control unit coincides with an address designated by the arithmetic processing unit; and a logic circuit to input the write enable signal to the bus control unit only when the arithmetic processing unit asserts a high-speed access signal indicating that now is in the high-speed access mode.

Advantageous Effects of Invention

The write enable circuit according to the present invention produces the effect of being able to shorten the time required for data transfer from the arithmetic unit to the bus control unit.

DESCRIPTION OF EMBODIMENTS

A write enable circuit, an access switching circuit, and an analog-to-digital converter unit according to an embodiment of the present invention will be described in detail below with reference to the drawings. Note that this embodiment is not intended to limit the present invention.

First Embodiment

Figure 1:
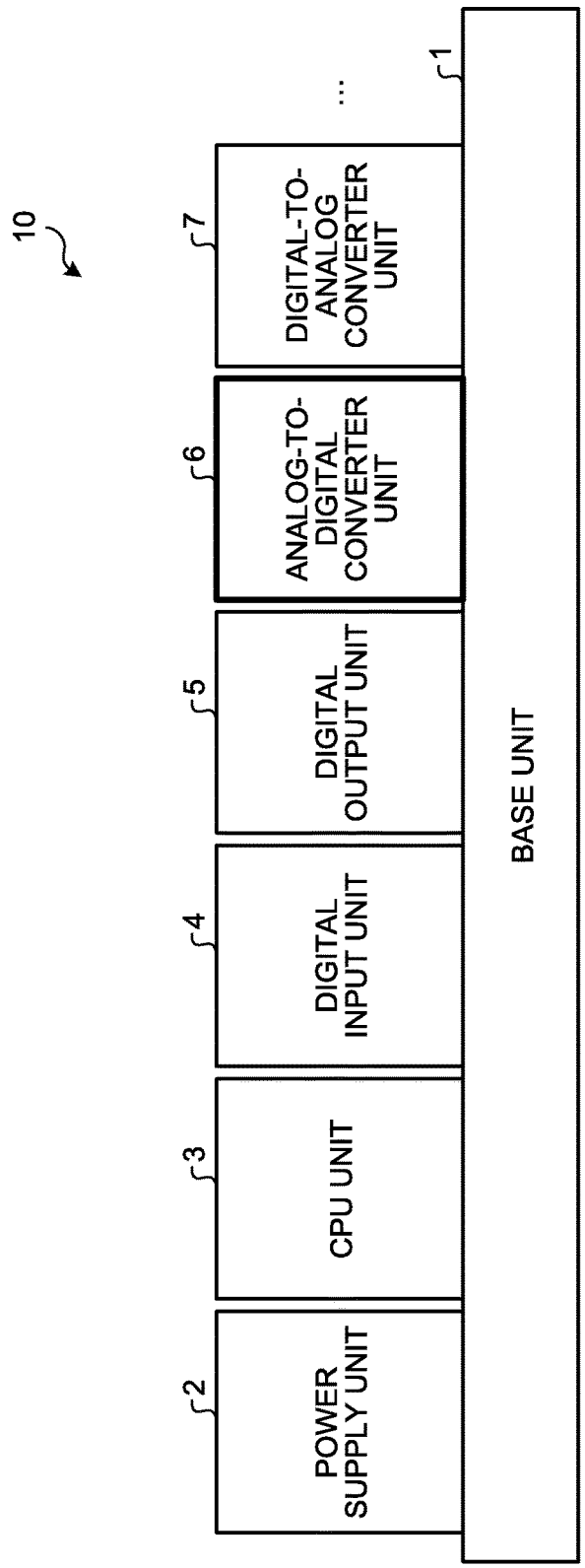
FIG. 1 is a diagram showing a configuration of a programmable logic controller system according to a first embodiment of the present invention.

FIG. 1 is a diagram showing the configuration of a programmable logic controller system 10 according to the first embodiment of the present invention. The programmable logic controller system 10 comprises a base unit 1 on which units are mounted, a power supply unit 2 supplying an electric power, a CPU unit 3 executing various kinds of control, a digital input unit 4 inputting a digital signal, a digital output unit 5 outputting a digital signal, an analog-to-digital converter unit 6 that converts an analog signal from the outside into a digital signal to take in, and a digital-to-analog converter unit 7 that converts a digital signal into an analog signal to output to the outside.

The power supply unit 2, the CPU unit 3, the digital input unit 4, the digital output unit 5, the analog-to-digital converter unit 6 and the digital-to-analog converter unit 7 are fixed on the base unit 1. A user controls the programmable logic controller system 10 via the CPU unit 3. The CPU unit 3 accesses the other units via the base unit 1.

Figure 2:
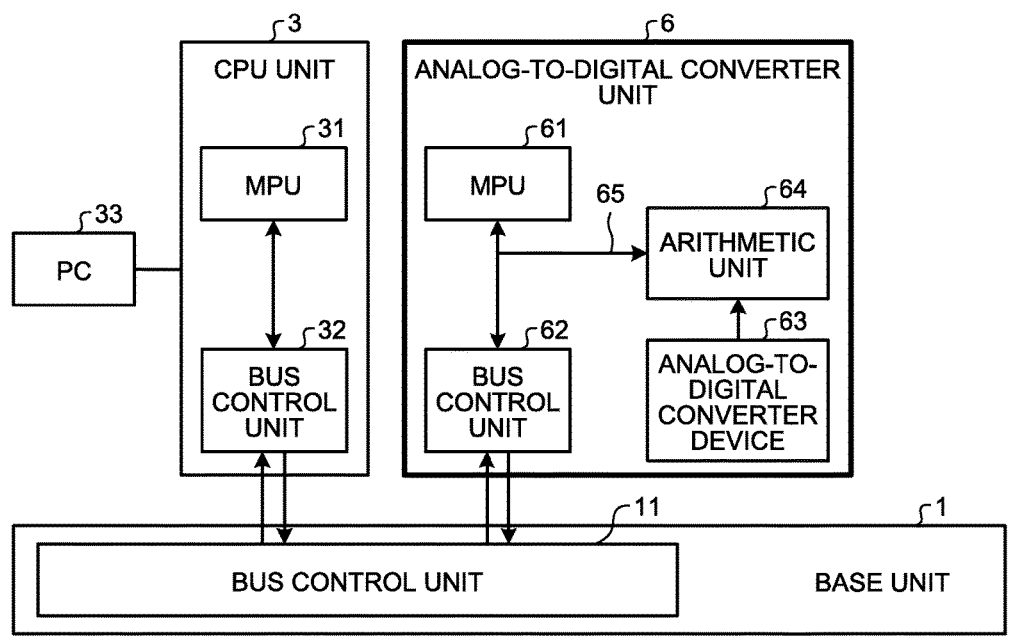
FIG. 2 is a diagram showing internal configurations of a CPU unit, an analog-to-digital converter unit and a base unit according to the first embodiment of the present invention.

FIG. 2 is a diagram showing the internal configurations of the CPU unit 3, the analog-to-digital converter unit 6 and the base unit 1 according to the first embodiment of the present invention.

The CPU unit 3 comprises an MPU 31 performing data processing and a bus control unit 32 performing data communication with the other units via the base unit 1. The CPU unit 3 is connected with a PC (Personal Computer) 33, and the user can make various kinds of settings via the PC 33.

The analog-to-digital converter unit 6 comprises an MPU 61 that is an arithmetic processing unit performing control and data processing for the analog-to-digital converter unit 6, a bus control unit 62 performing data communication with the other units via the base unit 1, an analog-to-digital converter device 63 converting analog data into digital data, and an arithmetic unit 64 performing arithmetic operations on the digital data. The arithmetic unit 64 performs various kinds of operations such as scaling and filtering on the digital data obtained by the conversion of the analog-to-digital converter device 63. The MPU 61, bus control unit 62, and arithmetic unit 64 are connected via a common bus 65. The base unit 1 comprises a bus control unit 11 that performs data communication with the other units to distribute signals.

Figure 3:
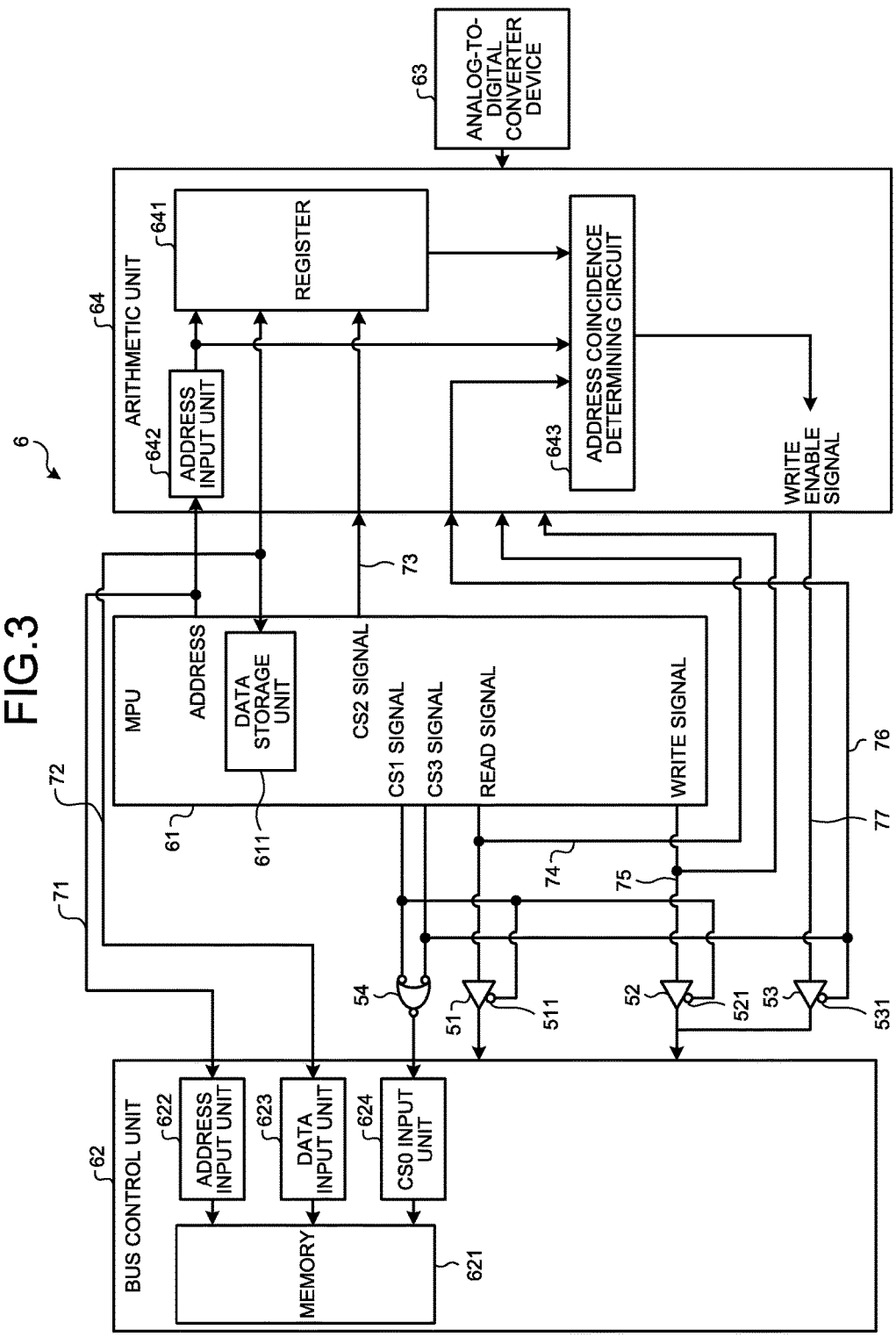
FIG. 3 is a diagram showing a detailed circuit configuration of the analog-to-digital converter unit according to the first embodiment of the present invention.

FIG. 3 is a diagram showing the detailed circuit configuration of the analog-to-digital converter unit 6 according to the first embodiment of the present invention.

The analog-to-digital converter unit 6 comprises three-state buffers 51, 52 and 53, which go into an "open state" in which their input signals are outputted as they are when a CS1 signal or CS3 signal described later is asserted, and a logical OR circuit 54 that performs an OR operation of the CS1 and CS3 signals to output, in addition to the MPU 61, bus control unit 62, analog-to-digital converter device 63 and arithmetic unit 64.

The three-state buffers 51, 52 and 53 that are first, second and third logic circuits comprise control terminals 511, 521, 531 respectively. When the control terminal 511 is asserted, the three-state buffer 51 goes into the "open state" to output its input value as it is and, when the control terminal 511 is not asserted, the buffer 51 is in a "closed state", which is a high impedance state. The three-state buffers 52 and 53 operate likewise.

Because the logical OR circuit 54 of FIG. 3 has inversion signs added to the inputs and output thereof respectively, it is a logical AND circuit, assuming that "1" is the true value. The CS1 and CS3 signals are asserted with low, that is, have their respective assert states of "0". Thus, if either the CS1 signal or the CS3 signal is asserted, the output has an assert state of low, and hence the logical OR circuit 54 eventually performs a logical OR operation of the CS1 and CS3 signals. The CS1 signal is connected to the control terminals 511 and 521 of the three-state buffers 51 and 52, and the CS3 signal is connected to the control terminal 531 of the three-state buffer 53. The control of the three-state buffers 51 and 52, and the control of the three-state buffer 53 are independent operations as described later. Therefore, the logical OR circuit 54 needs to be provided to electrically separate the CS1 signal for controlling the three-state buffers 51 and 52, and the CS3 signal for controlling the three-state buffer 53. The output of the logical OR circuit 54 being asserted indicates the presence of an access request from the MPU 61 to a memory 621.

The address outputted by the MPU 61 is inputted to the bus control unit 62 and the arithmetic unit 64 via an address line 71. Data are inputted and outputted between the MPU 61, the bus control unit 62, and the arithmetic unit 64 via a data line 72. The MPU 61 is equipped with a data storage unit 611 to store data received via the data line 72. The common bus 65 of FIG. 2 includes the address line 71 and the data line 72.

The bus control unit 62 comprises the memory 621. The memory 621 stores data from the CPU unit 3 and data from the MPU 61. The bus control unit 62 comprises an address input unit 622 to receive an address specified by the MPU 61, a data input unit 623 to receive data, and a CS0 input unit 624 to receive the output of the logical OR circuit 54.

The arithmetic unit 64 comprises a register 641 to hold data, an address input unit 642 to receive an address from the MPU 61, and an address coincidence determining circuit 643 to determine whether the address from the MPU 61 coincides with an address determined beforehand. The register 641 stores digital data obtained by the conversion of the analog-to-digital converter device 63, address data to be used by the address coincidence determining circuit 643, and other setting values. The address coincidence determining circuit 643 will be described later.

First, the user sets an access mode, either a "normal access mode" or a "high-speed access mode", in the bus control unit 32 of the CPU unit 3 via the PC 33. The CPU unit 3 sets either the "normal access mode" or the "high-speed access mode" in the memory 621 in the bus control unit 62 of the analog-to-digital converter unit 6 via the base unit 1 based on the setting by the user. The MPU 61 reads the set access mode, so that the analog-to-digital converter unit 6 operates in the access mode as described below. The "normal access mode" is an access mode in which digital data obtained by analog-to-digital conversion are temporarily written from the arithmetic unit 64 into the MPU 61 and then written into the bus control unit 62, and the "high-speed access mode" is an access mode in which digital data obtained by analog-to-digital conversion are written from the arithmetic unit 64 directly into the bus control unit 62.

When the "normal access mode" is set as the access mode in the memory 621, the analog-to-digital converter unit 6 performs the following operation.

When the "normal access mode" is set as the access mode, in FIG. 3, the MPU 61 uses the CS1 signal in accessing the bus control unit 62 and the CS2 signal in accessing the arithmetic unit 64.

Where digital data obtained by conversion from analog data by the analog-to-digital converter device 63 and stored in the arithmetic unit 64 is temporarily written into the MPU 61 and then written into the bus control unit 62, first a read operation is performed.

That is, the MPU 61 asserts the CS2 signal to transmit it to the arithmetic unit 64 via a signal line 73. Further, the MPU 61 inputs a turned-on read signal to the arithmetic unit 64 via a signal line 74 and inputs an address for the register 641 designated by the MPU 61 to the address input unit 642. The arithmetic unit 64 outputs data corresponding to the address inputted into the address input unit 642 from the register 641 in which digital data obtained by conversion of the analog-to-digital converter device 63 are stored for each address, to the data storage unit 611 of the MPU 61 via the data line 72. Then the read signal is turned off.

Next, the MPU 61 asserts the CS1 signal as a normal access signal indicating that now is in the "normal access mode." Since the CS1 signal is asserted, the OR operation result of the logical OR circuit 54 is also asserted, so that the logical OR circuit 54 asserts the CS0 input unit 624 of the bus control unit 62. Then the MPU 61 turns on a write signal. The CS1 signal is also inputted to the control terminal 521, and the CS1 signal is asserted and thereby the control terminal 521 is also asserted, so that the three-state buffer 52 is in the "open state". Thus, the turned-on write signal is inputted to the bus control unit 62 via a signal line 75 and the three-state buffer 52.

The MPU 61 designates and inputs an address for the memory 621 to the address input unit 622 of the bus control unit 62 via the address line 71. Because the CS0 input unit 624 is asserted, the address is inputted to the address input unit 622, and the turned-on write signal is inputted to the bus control unit 62, the bus control unit 62 recognizes that the bus control unit 62 is in a write state. Then, data stored in the data storage unit 611 are outputted to the data input unit 623 via the data line 72. The bus control unit 62 writes the data inputted to the data input unit 623 at the address inputted to the address input unit 622 of the memory 621.

When the "high-speed access mode" is set as the access mode in the memory 621, the analog-to-digital converter unit 6 performs the following operation.

First, the MPU 61 asserts the CS3 signal as a high-speed access signal indicating that now is in the "high-speed access mode." The asserted CS3 signal is inputted to the arithmetic unit 64 via a signal line 76. Further, the MPU 61 inputs the turned-on read signal to the arithmetic unit 64 via the signal line 74. Then, the MPU 61 inputs an address for the memory 621 of the bus control unit 62 to the address input unit 642. Here, the address inputted to the address input unit 642 is an address in the memory 621 storing digital data obtained by analog-to-digital conversion.

When the asserted CS3 signal is inputted to the arithmetic unit 64, the arithmetic unit 64 performs operation for the "high-speed access mode." Specifically, when the asserted CS3 signal is inputted to the address coincidence determining circuit 643, the address coincidence determining circuit 643 determines whether or not the address inputted into the address input unit 642 coincides with an address preset in the register 641. Predetermined addresses in the memory 621 of the bus control unit 62 that stores digital data obtained by analog-to-digital conversion are set in the register 641.

When the address inputted to the address input unit 642 coincides with an address preset in the register 641, the address coincidence determining circuit 643 turns on and sends a write enable signal to the three-state buffer 53 via a signal line 77. The CS3 signal is also inputted to the control terminal 531, and the CS3 signal is asserted and thereby the control terminal 531 is also asserted, so that the three-state buffer 53 is in the "open state." Therefore, the turned-on write enable signal is inputted to the bus control unit 62 via the signal line 77 and the three-state buffer 53. The register 641 outputs digital data obtained by analog-to-digital conversion to the data input unit 623 of the bus control unit 62 via the data line 72.

Since the asserted CS3 signal makes the OR operation result of the logical OR circuit 54 asserted, the logical OR circuit 54 asserts the CS0 input unit 624. The same address for the memory 621 as that having been inputted to the address input unit 642 by the MPU 61 is inputted to the address input unit 622. Although the read signal outputted by the MPU 61 is inputted to the three-state buffer 51. However, because the CS1 signal is not asserted in the "high-speed access mode", the three-state buffer 51 is in the "closed state", so that the read signal is not inputted to the bus control unit 62. Instead, the write enable signal outputted by the address coincidence determining circuit 643 is inputted to the bus control unit 62 via the three-state buffer 53.

Here, because the CS0 input unit 624 is asserted, the address is inputted to the address input unit 622, and the turned-on write signal is inputted to the bus control unit 62, the bus control unit 62 recognizes that the bus control unit 62 is in the write state. Then, the digital data obtained by analog-to-digital conversion, which have been inputted to the data input unit 623, is written at the address in the memory 621 outputted by the MPU 61, that is, the predetermined address set in the register 641.

Where the MPU 61 reads data from the bus control unit 62, the MPU 61 asserts the CS1 signal to put the three-state buffer 51 into an "open state", and turns on the read signal, so that the turned-on read signal is inputted to the bus control unit 62.

With the write enable circuit, the access switching circuit and the analog-to-digital converter unit according to the first embodiment, it is possible to switch between the "normal access mode" in which digital data obtained by analog-to-digital conversion are temporarily written from the arithmetic unit 64 into the MPU 61 and then written into the bus control unit 62 and the "high-speed access mode" in which the digital data are written from the arithmetic unit 64 directly into the bus control unit 62. In the "high-speed access mode", only turning on the read signal causes execution of writing from the arithmetic unit 64 into the bus control unit 62, so that shortening the data transfer time can be easily realized. Therefore, it is possible to shorten the sampling period of analog-to-digital conversion, so that high resolution can be achieved. Further, the response speed of the analog-to-digital converter unit can be improved.

The configuration described in the above embodiment shows an example of the content of the present invention and can be combined with other publicly known techniques, and can be partially omitted or modified without departing from the scope of the invention.

REFERENCE SIGNS LIST

1 base unit; 2 power supply unit; 3 CPU unit; digital input unit; 5 digital output unit; 6 analog-to-digital converter unit; 7 digital-to-analog converter unit; 10 programmable logic controller system; 11, 32, 62 bus control unit; 31 MPU; 33 PC; 51, 52, 53 three-state buffer; 54 logical OR circuit; 61 MPU; 63 analog-to-digital converter device; 64 arithmetic unit; 71 address line; 72 data line; 73, 74, 75, 76, 77 signal line; 622, 642 address input unit; 623 data input unit; 624 CS0 input unit; 641 register; 643 address coincidence determining circuit.

The invention claimed is:

1. A write enable circuit that outputs a write enable signal for digital data obtained by analog-to-digital conversion, in an analog-to-digital converter unit comprising a bus control unit connected to an external unit, an arithmetic processing unit to perform data processing, and an arithmetic unit to hold the digital data, and having a normal access mode in which the digital data are temporarily written into the arithmetic processing unit and then written into the bus control unit and a high-speed access mode in which the digital data are written directly into the bus control unit, the write enable circuit comprising:

an address coincidence determining circuit provided in the arithmetic unit to output a write enable signal from the arithmetic unit when a predetermined address for a memory of the bus control unit coincides with an address designated by the arithmetic processing unit; and a logic circuit to input the write enable signal to the bus control unit only when the arithmetic processing unit asserts a high-speed access signal indicating that now is in the high-speed access mode.

2. An access switching circuit that switches an access mode, in an analog-to-digital converter unit comprising a bus control unit connected to an external unit, an arithmetic processing unit to perform data processing, and an arithmetic unit to hold digital data obtained by analog-to-digital conversion, and having a normal access mode in which the digital data are temporarily written into the arithmetic processing unit and then written into the bus control unit and a high-speed access mode in which the digital data are written directly into the bus control unit, the access switching circuit comprising:

a logical OR circuit to perform an OR operation of a normal access signal indicating that now is in the normal access mode and a high-speed access signal indicating that now is in the high-speed access mode, which are outputted by the arithmetic processing unit, and output a result of the OR operation to the bus control unit;

a first logic circuit to input a read signal from the arithmetic processing unit to the bus control unit only when the arithmetic processing unit asserts the normal access signal; and a second logic circuit to input a write signal from the arithmetic processing unit to the bus control unit only when the arithmetic processing unit asserts the normal access signal.

3. An analog-to-digital converter unit comprising a bus control unit connected to an external unit, an arithmetic processing unit to perform data processing, and an arithmetic unit to hold digital data obtained by analog-to-digital conversion, and having a normal access mode in which the digital data are temporarily written into the arithmetic processing unit and then written into the bus control unit and a high-speed access mode in which the digital data are written directly into the bus control unit, the analog-to-digital converter unit comprising:

a logical OR circuit to perform an OR operation of a normal access signal indicating that now is in the normal access mode and a high-speed access signal indicating that now is in the high-speed access mode, which are outputted by the arithmetic processing unit, and output a result of the OR operation to the bus control unit;

a first logic circuit to input a read signal from the arithmetic processing unit to the bus control unit only when the arithmetic processing unit asserts the normal access signal;

a second logic circuit to input a write signal from the arithmetic processing unit to the bus control unit only when the arithmetic processing unit asserts the normal access signal;

an address coincidence determining circuit provided in the arithmetic unit to output a write enable signal from the arithmetic unit when a predetermined address for a memory of the bus control unit coincides with an address designated by the arithmetic processing unit; and a third logic circuit to input the write enable signal to the bus control unit only when the arithmetic processing unit asserts the high-speed access signal.

* * * * *